(12) United States Patent
Kanitz

(10) Patent No.: US 6,310,396 B1
(45) Date of Patent: Oct. 30, 2001

(54) SEMICONDUCTOR CIRCUIT APPARATUS AND METHOD FOR FABRICATING THE SEMICONDUCTOR CIRCUIT APPARATUS

(75) Inventor: Sven Kanitz, Ubstadt-Weiher (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/472,221

(22) Filed: Dec. 27, 1999

Related U.S. Application Data

(63) Continuation of application No. PCT/DE98/01741, filed on Jun. 24, 1998.

(30) Foreign Application Priority Data

Jun. 24, 1997 (DE) .............................................. 197 26 881

(51) Int. Cl.$^7$ .......................... H01L 23/48; H01L 23/52; H01L 29/40
(52) U.S. Cl. .......................... 257/748; 257/758; 257/774; 257/750; 257/665
(58) Field of Search .................................... 257/758, 750, 257/774, 665, 770, 763, 764, 748; 438/215

(56) References Cited

U.S. PATENT DOCUMENTS

| | | | |
|---|---|---|---|
| 5,025,300 | 6/1991 | Billig et al. ........................... | 257/768 |
| 5,202,275 | 4/1993 | Sugiura et al. ....................... | 438/231 |
| 5,314,840 | * 5/1994 | Schepis et al. ....................... | 438/600 |
| 5,618,750 | 4/1997 | Fukuhura et al. .................... | 438/643 |
| 5,759,876 | * 6/1998 | Singlevich et al. .................. | 438/131 |

FOREIGN PATENT DOCUMENTS

| | | |
|---|---|---|
| 0 469 252 A1 | 2/1992 | (EP) . |
| 0 469 728 A1 | 2/1992 | (EP) . |
| 0 210 397 A1 | 2/1998 | (EP) . |

OTHER PUBLICATIONS

"A Modular Architecture for a 6.4–Gbyte/s, 8–Mb DRAM–Integrated Media Chip" (Watanabe et al.), IEEE Journal of Solid–State Circuits, vol. 32, No. 5, May 1997, pp. 635–640.

\* cited by examiner

*Primary Examiner*—Jhihan B Clark
(74) *Attorney, Agent, or Firm*—Herbert L. Lerner; Laurence A. Greenberg; Werner H. Stemer

(57) ABSTRACT

A monolithically integrated semiconductor circuit apparatus includes circuit elements disposed on a semiconductor substrate. The circuit elements include at least one semiconductor memory device, drive circuits, and a digital logic component monolithically integrated on the semiconductor substrate. A first contact-making plane is provided which is closer to a main surface of the semiconductor substrate than a penultimate contact-making plane, which is closer to the main surface of the semiconductor substrate than a last contact-making plane. The first, penultimate, and last interconnect patterns electrically interconnect the plurality of circuit elements. A protection device is formed at least in a partial region of the penultimate interconnect pattern. The protection device includes at least a fuse or an antifuse and is assigned to a redundancy activation for defective memory cells and memory cell groups in the semiconductor memory device. The invention furthermore relates to a method for fabricating such a monolithically integrated semiconductor circuit apparatus.

8 Claims, 2 Drawing Sheets

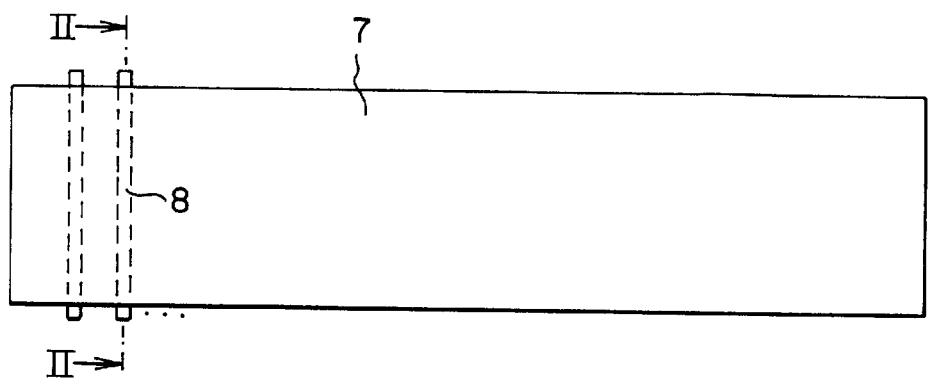
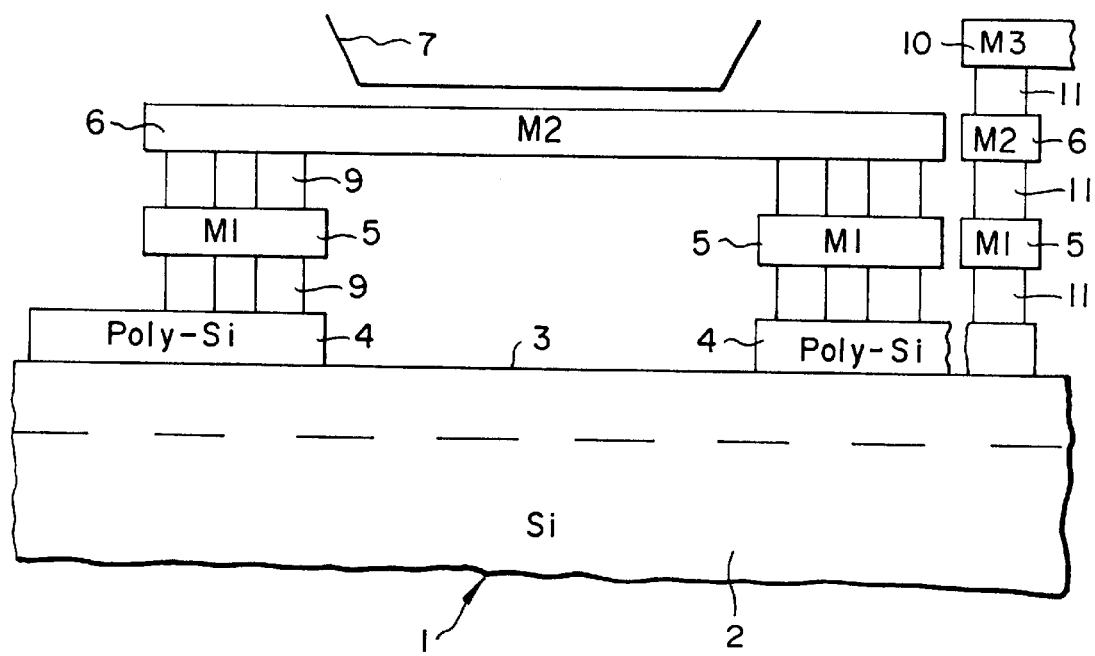

SEMICONDUCTOR CIRCUIT APPARATUS AND METHOD FOR FABRICATING THE SEMICONDUCTOR CIRCUIT APPARATUS

CROSS-REFERENCE TO RELATED APPLICATION

This is a continuation of copending International Application PCT/DE98/01741, filed Jun. 24, 1998, which designated the United States.

BACKGROUND OF THE INVENTION

FIELD OF THE INVENTION

The invention relates to a monolithically integrated semiconductor circuit apparatus having a semiconductor substrate, in which or on which a plurality of circuit elements are formed. The circuit elements are electrically interconnected and, if necessary, connected to contact points, in particular to contact points disposed at an edge of the semiconductor substrate. The electrical interconnection is done with interconnect patterns which are provided in a plurality of contact-making planes, beginning with a first contact-making plane, which is closest to the main surface of the semiconductor substrate, and ranging to a last contact-making plane. The invention furthermore relates to a method for fabricating such a monolithically integrated semiconductor circuit apparatus.

Fuse structures are used in integrated circuits in order to interrupt ("fuse") or reestablish ("antifuse") electrically conductive connections through the use of laser irradiation after the actual production process. In programmable logic arrays (PLAs), the logic combinations are programmed by fuses. In safety-critical circuits, fuses are used to prevent access to test modes of the circuit by unauthorized persons. In the case of the use of fuses as in the method and the device of the invention, the fuses are used in order to activate redundant circuit sections, namely memory cells, and to disconnect defective ones. When using polysilicon fuses or else metal fuses for the redundancy activation of defective memory cells in dynamic random access memories (DRAMs) with many metalization layers, problems arise with regard to the reliability of the activation by burning through or "blowing" polysilicon interconnects or metal interconnects (M1 interconnects). These problems are further intensified, and have remained unsolved heretofore, when a semiconductor memory device normally having two metalization layers (M1, M2) and a digital logic component having, by contrast, at least one further metalization plane (M3) are intended to be combined on one and the same semiconductor substrate. Since the logic component thus has more than two metalization layers, severing polysilicon interconnects located at a deeper level for the purpose of activating the fuse is associated with great risks and faults.

SUMMARY OF THE INVENTION

It is accordingly an object of the invention to provide a monolithically integrated semiconductor circuit apparatus and a method for fabricating such a monolithically integrated semiconductor circuit apparatus which overcome the above-mentioned disadvantages of the heretofore-known methods and devices of this general type and in which a risk-free and fault-free activation of fuses can be ensured even when there are more than two metalization planes.

With the foregoing and other objects in view there is provided, in accordance with the invention, a method for fabricating a monolithically integrated semiconductor circuit apparatus, the method including the steps of forming circuit elements on or in a semiconductor substrate, the circuit elements including at least one complete semiconductor memory device with associated drive circuits and a complete digital logic component monolithically integrated on the semiconductor substrate; forming interconnect patterns in a plurality of contact-making planes, the plurality of contact-making planes including a first contact-making plane, a penultimate contact-making plane, and a last contact-making plane, the first contact-making plane being closer to a main surface of the semiconductor substrate than the penultimate contact-making plane, and the penultimate contact-making plane being closer to the main surface of the semiconductor substrate than the last contact-making plane; electrically interconnecting the circuit elements with the interconnect patterns; forming a protection device from one of the interconnect patterns in at least a partial region of the penultimate contact-making plane, the protection device having at least one of fuses and antifuses; and assigning the protection device to a redundancy activation of at least one of defective memory cells and memory cell groups of the semiconductor memory device.

In accordance with another mode of the invention, contact points are formed at an edge of the semiconductor substrate; and the contact points and the circuit elements are electrically interconnected.

In accordance with yet another mode of the invention, the at least one complete semiconductor memory device is a dynamic read-write memory or DRAM having a storage capacity of at least 1 megabit and preferably at least 4 megabits.

In accordance with yet a further mode of the invention, a first interconnect pattern including polysilicon is formed in the first contact-making plane, a second interconnect pattern including a metal is formed in a second contact-making plane, and a third interconnect pattern including a metal is formed in a third contact-making plane.

In accordance with an added mode of the invention, further interconnect patterns including a metal are formed in further contact-making planes.

With the objects of the invention in view there is also provided, a monolithically integrated semiconductor circuit apparatus, including a semiconductor substrate having a main surface; a plurality of circuit elements disposed on or in the semiconductor substrate, the plurality of circuit elements including at least one completely formed semiconductor memory device having at least one of memory cells and memory cell groups, drive circuits associated with the at least one completely formed semiconductor memory device, and a complete digital logic component monolithically integrated on the semiconductor substrate; a plurality of contact-making planes including a first contact-making plane having a first interconnect pattern, a penultimate contact-making plane having a penultimate interconnect pattern with a partial region, and a last contact-making plane having a last interconnect pattern, the first contact-making plane being closer to the main surface of the semiconductor substrate than the penultimate contact-making plane, the penultimate contact-making plane being closer to the main surface of the semiconductor substrate than the last contact-making plane, the first, the penultimate, and the interconnect patterns being provided for electrically interconnecting the plurality of circuit elements; and a protection device formed at least in the partial region of the penultimate interconnect pattern, the protection device including at least one of a fuse and an antifuse and being assigned to a redundancy activation for defective ones of the memory cells and memory cell groups in the semiconductor memory device. A fuse is defined as any connection that may be severed or interrupted, an antifuse is defined as any interruption in a connection that may be connected.

In accordance with another feature of the invention, contact points or contact pads are disposed on the semiconductor substrate. At least one of the first, penultimate, and last interconnect patterns electrically interconnect at least one of the plurality of circuit elements to the contact points.

In accordance with yet another feature of the invention, the semiconductor substrate includes an edge, and the contact points are disposed at the edge of the semiconductor substrate.

In accordance with a further feature of the invention, the at least one complete semiconductor memory device is a dynamic read-write memory or a DRAM having a storage capacity of at least 4 megabytes, and preferably at least 16 megabytes.

In accordance with yet a further feature of the invention, the fuse or the antifuse is formed of a metal.

In accordance with another feature of the invention, the plurality of contact-making planes includes at least the first contact-making plane having the first interconnect pattern formed of polysilicon, and a second and a third contact-making plane having a second and a third interconnect pattern formed of a metal.

In accordance with yet another feature of the invention, the plurality of contact-making planes includes in addition to the first, second, and third contact-making planes further contact-making planes having further interconnect patterns formed of a metal.

According to the invention a protection device includes fuses or antifuses to be formed at least from parts of the interconnect pattern of the penultimate contact-making plane. The configuration of the protection device within the penultimate contact-making plane, for example in the plane M2 in the case of a four-layer interconnect structure with metalization layers M1, M2, M3, reduces the disadvantageous influences of layer thickness fluctuations in the layers situated underneath, and thus increases the reliability of the redundancy activation. At the same time, it is possible to reduce the fabrication costs by reducing the etching time during the production of the fuse window. Furthermore, it is possible to lay interconnects without an additional space requirement by using so-called stacked vias.

A particularly preferred embodiment provides for the monolithically integrated semiconductor circuit apparatus to have at least one completely formed semiconductor memory device with the associated drive circuits and, monolithically integrated on the same semiconductor substrate, a complete digital logic component, and the protection device to be assigned to the redundancy activation of defective memory cells or memory cell groups of the semiconductor memory device.

In this case, the semiconductor memory device constitutes, in particular, a dynamic random access memory (DRAM) having a storage capacity of at least 1 megabit, in particular at least 4 megabits. At least three contact-making planes are advantageously provided, the first contact-making plane having an interconnect pattern made of polysilicon and the second, third and, if appropriate, further contact-making planes each having an interconnect pattern made of metal.

Other features which are considered as characteristic for the invention are set forth in the appended claims.

Although the invention is illustrated and described herein as embodied in a semiconductor circuit apparatus and method for fabricating such a semiconductor circuit apparatus, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a schematic top view of a fuse window with fuse interconnects to be severed in a monolithically integrated semiconductor circuit apparatus;

FIG. 2 is a diagrammatic cross sectional view of the semiconductor circuit apparatus according to the invention along the section line II—II of FIG. 1.

DESCRIPTION OF THE PREFERRED EMBODIMENTS

Figure 3:
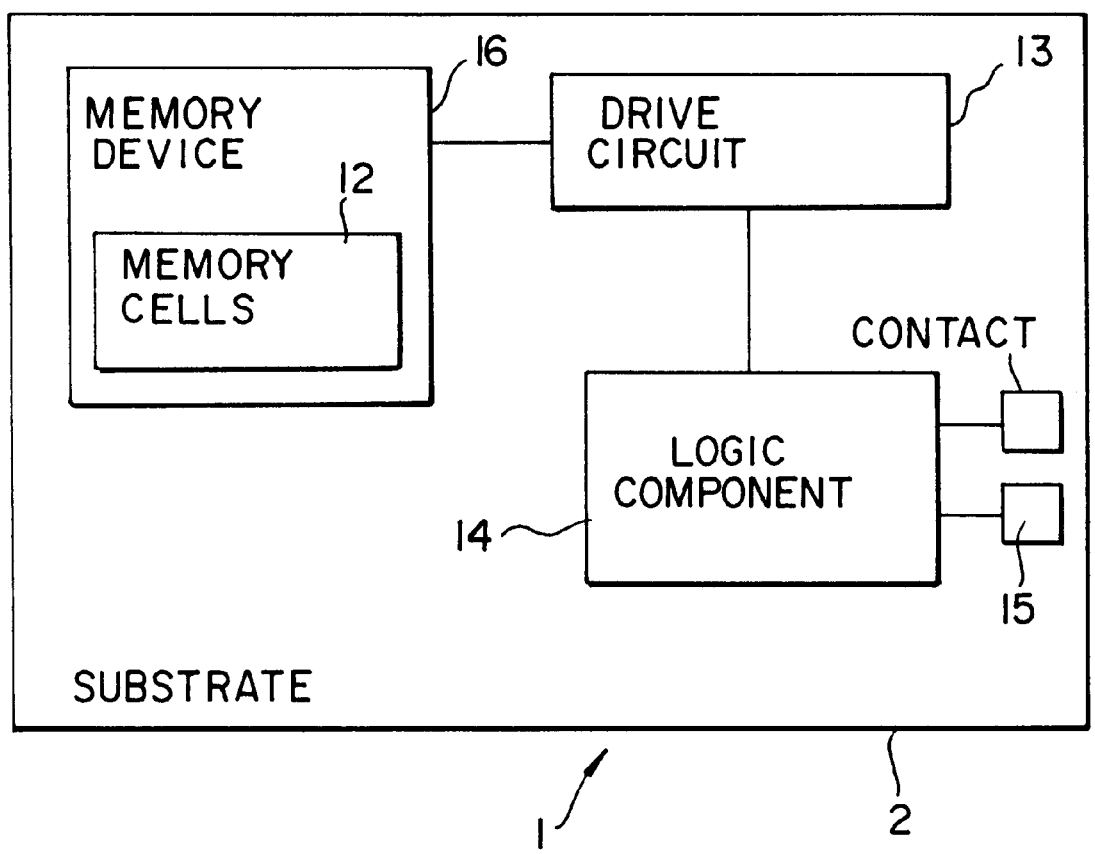
FIG. 3 is a block diagram of an exemplary monolithically integrated semiconductor circuit apparatus.

Referring now to the figures of the drawings in detail and first, particularly, to FIGS. 1 and 2 thereof, there is shown, in a diagrammatically simplified manner, a monolithically integrated semiconductor circuit apparatus 1 having a semiconductor substrate 2 made of monocrystalline silicon, in which or on which a plurality of circuit elements, such as, for example, logic gates, transistors, memory cells and similar digital circuits, are formed, which are electrically interconnected and, if required, connected to other contact points, in particular to contact points disposed at the edge of the semiconductor substrate 2, through the use of interconnect patterns 4, 5, 6, 10 which are provided in a plurality of contact-making planes.

In the case of the exemplary embodiment illustrated, the interconnect patterns 4, 5, 6, 10 are disposed in the four contact-making planes poly-Si, M1, M2, M3, beginning with the first contact-making plane poly-Si, which is the closest to the main surface 3 of the semiconductor substrate 2, and ranging to the last contact-making plane M3, which is only indicated schematically. The precise formation and configuration of the actual circuit elements which are produced in or on the surface 3 of the substrate 2, and also of the contact points or pads disposed in particular at the edge of the substrate, is sufficiently well known and has been omitted, therefore, in the figures for the sake of clarity.

The exemplary embodiment illustrated concerns a monolithically integrated semiconductor circuit apparatus having a DRAM memory device having a storage capacity of 1.5 megabits, and also a digital logic component in the form of a microprocessor on the same substrate 2. Consequently, a DRAM memory component and a logic component are combined in the case of the semiconductor circuit apparatus according to the invention. Four contact-making planes are provided; an interconnect pattern made of polysilicon interconnects is formed in the first contact-making plane, the pattern serving, by way of example, to make contact with gate terminals of the MOS components which are formed in or on the substrate 2. The interconnect pattern 5 of the second contact-making plane M1 made of metal, in particular aluminum or tungsten, the interconnect pattern 6 of the penultimate contact-making plane M2, again made of metal, in particular aluminum or tungsten, make contact via tungsten plugs 9 on polysilicon. As seen in FIG. 2, also the interconnect pattern 10 of the last contact-making plane (M3) makes contact via further tungsten plugs 11. The invention provides for the fuses 8 of the protection device to be laid in the penultimate contact-making plane, in this case the metalization plane M2, in order to reduce influences of layer thickness fluctuations of the layers situated underneath and ultimately to increase the reliability of the redundancy activation. At the same time, the fabrication costs are reduced by reducing the etching time during the fabrication of the fuse window 7.

The fuse interconnects 8 are produced from the material of the metalization plane M2, for example Al or AlSiCu. Only two of such fuse interconnects are indicated in FIG. 1. In reality, substantially more fuse interconnects, which are disposed such that they lie parallel next to one another, are provided within the fuse window 7 and are melted, for example with a Neodymium YAG laser, locally that is to say in a typical width of from 2 $\mu$m to approximately 5 $\mu$m and are interrupted in this way.

The invention is not limited to four layers of contact-making planes with metalization layers M1, M2, M3 as illustrated. More complex logic components generally require more than two metalization planes, that is to say M3, M4 and so forth. What is crucial in this case is that, following the principle of the invention, the fuse interconnects 8 to be severed are always laid in the penultimate contact-making plane, that is to say, by way of example, in the plane M4 in the case of a semiconductor circuit apparatus which ranges as far as the metalization plane M5.

FIG. 3 is a block diagram of an exemplary monolithically integrated semiconductor circuit apparatus 1. A plurality of circuit elements 13, 14, 16 are disposed on the semiconductor substrate 2. The plurality of circuit elements includes at least one semiconductor memory device 16 having memory cells 12 or memory cell groups, a drive circuitry 13 which is connected to the semiconductor memory device 16, and a digital logic component 14. Contact pads 15 are used to contact the circuit elements.

I claim:

1. A monolithically integrated semiconductor circuit apparatus, comprising:

a semiconductor substrate having a main surface;

a plurality of circuit elements disposed at least one of on said semiconductor substrate and in said semiconductor substrate, said plurality of circuit elements including at least one completely formed semiconductor memory device having at least one of memory cells and memory cell groups, drive circuits associated with said at least one completely formed semiconductor memory device, and a complete digital logic component monolithically integrated on said semiconductor substrate;

a plurality of contact-making planes including a first contact-making plane having a first interconnect pattern, a penultimate contact-making plane having a penultimate interconnect pattern with a partial region, and a last contact-making plane having a last interconnect pattern, said first contact-making plane being closer to said main surface of said semiconductor substrate than said penultimate contact-making plane, said penultimate contact-making plane being closer to said main surface of said semiconductor substrate than said last contact-making plane, said first, penultimate, and last interconnect patterns being provided for electrically interconnecting said plurality of circuit elements; and a protection device formed at least in said partial region of said penultimate interconnect pattern, said protection device including at least one of a fuse and an antifuse and being assigned to a redundancy activation for defective ones of said memory cells and memory cell groups in said semiconductor memory device.

2. The semiconductor circuit apparatus according to claim 1, including contact points disposed on said semiconductor substrate, at least one of said first, penultimate, and last interconnect patterns electrically interconnecting at least one of said plurality of circuit elements to said contact points.

3. The semiconductor circuit apparatus according to claim 1, wherein said at least one complete semiconductor memory device is a dynamic read-write memory having a storage capacity of at least 4 megabytes.

4. The semiconductor circuit apparatus according to claim 1, wherein said at least one complete semiconductor memory device is a dynamic read-write memory having a storage capacity of at least 16 megabytes.

5. The semiconductor circuit apparatus according to claim 1, wherein said at least one of said fuse and said antifuse is formed of a metal.

6. The semiconductor circuit apparatus according claim 1, wherein said plurality of contact-making planes includes at least said first contact-making plane having said first interconnect pattern formed of polysilicon, and a second and a third contact-making plane having a second and a third interconnect pattern formed of a metal.

7. The semiconductor circuit apparatus according to claim 2, wherein said semiconductor substrate includes an edge, and said contact points are disposed at said edge of said semiconductor substrate.

8. The semiconductor circuit apparatus according claim 6, wherein said plurality of contact-making planes includes in addition to said first, second, and third contact-making planes further contact-making planes having further interconnect patterns formed of a metal.

* * * * *